United States Patent [19]

Schoenherr

[11] Patent Number: 5,265,189
[45] Date of Patent: Nov. 23, 1993

[54] SERIAL EVAPORATOR FOR VACUUM VAPOR DEPOSITING APPARATUS

[75] Inventor: Bernhard Schoenherr, Offenbach, Fed. Rep. of Germany

[73] Assignee: Leybold Aktiengesellschaft, Hanau I, Fed. Rep. of Germany

[21] Appl. No.: 764,889

[22] Filed: Sep. 24, 1991

[30] Foreign Application Priority Data

Jul. 15, 1991 [DE] Fed. Rep. of Germany ....... 4123342

[51] Int. Cl.⁵ .............................................. C23C 14/00
[52] U.S. Cl. ..................................... 392/389; 118/726
[58] Field of Search ................ 392/389, 388; 118/726, 118/727

[56] References Cited

U.S. PATENT DOCUMENTS

| | | | |
|---|---|---|---|
| 2,969,448 | 1/1961 | Alexander . | |
| 3,117,887 | 1/1964 | Shepard | 392/389 |
| 3,271,209 | 9/1966 | Rummel | 118/726 |
| 3,387,116 | 6/1968 | Dupuis | 219/541 |
| 3,537,886 | 11/1970 | Rively | 392/389 |
| 3,861,353 | 1/1975 | Erhart | 118/726 |
| 5,068,915 | 11/1991 | Heinz | 392/389 |

FOREIGN PATENT DOCUMENTS 4016225.7  5/1990  Fed. Rep. of Germany .

OTHER PUBLICATIONS

U.S. patent application Ser. No. 574,595 dated Aug. 29, 1990, Kleyer.

Primary Examiner—Teresa J. Walberg
Attorney, Agent, or Firm—Felfe & Lynch

[57] ABSTRACT

In a row evaporator for vacuum vapor depositing apparatus, having a plurality of conductively heated evaporator cells (5, 5', ...) disposed in the process chamber (11) and individually controllable in output, and connected to jaw-like electrical contacts (3, 3', ...; 4, 4', ...), the jaw-like contacts are held by an electrically conductive supporting body (6) extending over the entire length of the row evaporator, while the contacts (3, 3', ...) of the one polarity are electrically connected to the supporting body (6), and the contacts (4, 4', ...) of the other polarity are subject to the action of a plunger (9, 9', ...) which is configured as a cylindrical bolt and is brought outwardly through the wall (10) of the process chamber so as to be vacuum-tight yet longitudinally displaceable, so that the cross-sectional area of this plunger (9, 9', ...) remains exposed to atmospheric pressure during the operation of the apparatus, and then presses the contacts or jaws (4, 4', ...) against their individual evaporator cells (5, 5', ...) with sufficiently measured force.

5 Claims, 2 Drawing Sheets

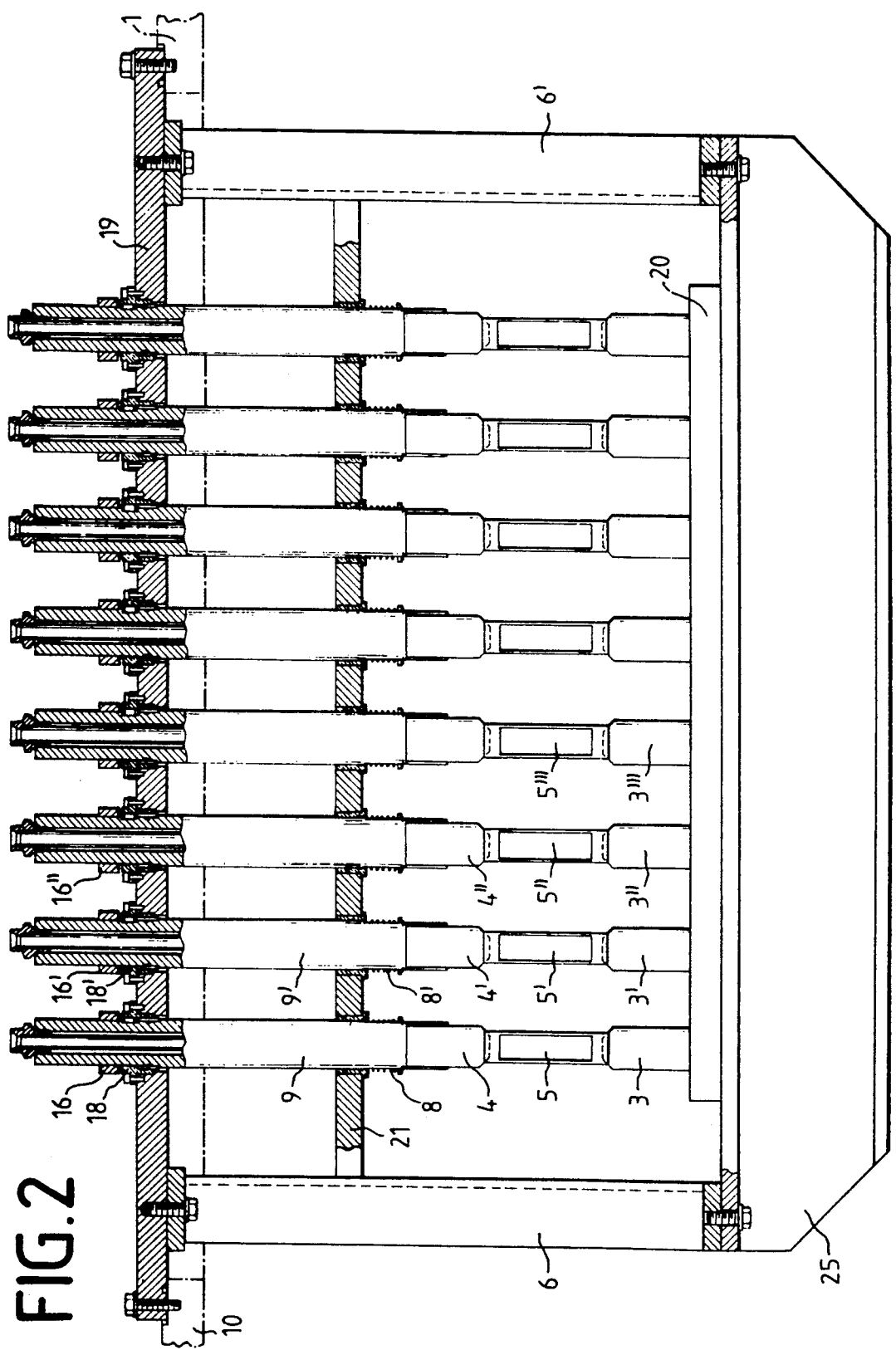

5,265,189

SERIAL EVAPORATOR FOR VACUUM VAPOR DEPOSITING APPARATUS

BACKGROUND OF THE INVENTION

1. Field of the Invention

The invention relates to a row evaporator for vacuum vapor depositing apparatus, especially for tape coating apparatus, consisting of a plurality of conductively heated evaporator cells disposed in the process chamber and individually controllable in output, and connected to jaw-like electrical contacts, the contacts being held by an electrically conductive support extending over the entire length of the row evaporator, and the jaw-like contacts of the one polarity being electrically connected to the support, while the jaw-like contacts of the other polarity are mounted in an insulated manner on the support and are connected to electrical feeders held in an insulated manner.

2. Description of the Related Art

A row evaporator is known (U.S. Pats. Nos. 3,387,116 and 2,969,448) in which the trough-shaped evaporator cell is clamped between a first, stationary, stud-like feeder and a spring-biased block held and guided on a second stationary feeder.

Also known is a row evaporator for tape coating apparatus (P 40 16 225.7) consisting of a plurality of controlled-power, conductively heated evaporators in contact with stud-like contacts wherein the stud-like contacts are held each by an electrically conductive support extending over the entire length of the row evaporator and the contacts are electrically connected to the support, while the contacts of the other polarity are brought with insulation through the support and connected to conductor wires disposed in an insulated manner. One of the electrical feeders of an evaporator is subjected to the thrust of a spring whose bias is adjustable by an adjusting cam, so that the clamping forces holding and securing the evaporator in its position are individually adjustable.

SUMMARY OF THE INVENTION

The present invention is addressed to the problem of creating a row evaporator in which a plurality of individual evaporators can be clamped between the electrical contacts with the assurance that the passage of current during the evaporating process will in no case be interrupted, and on the other hand the cost of construction can be kept low. Furthermore it must assure that any defect or any leakage in the cooling system of the row evaporator will not be able to lead to an irruption of water into the process chamber.

This problem is solved in accordance with the invention by the fact that each jaw-like contact of the other polarity is clamped to a plunger extending in a plane parallel to the plane of the evaporator cell or is integral with this plunger, while the end of the plunger facing away from the evaporator is brought sealingly through the wall of the process chamber and thus is exposed to the ambient pressure.

BRIEF DESCRIPTION OF THE DRAWING

The invention admits of a great variety of embodiments; one of them is shown in the appended drawings, wherein:

FIG. 2 is a top view of a plurality of evaporators arranged side by side in a vacuum vapor coating apparatus (evaporator bank), partially in section and on a scale smaller than that of FIG. 1.

DESCRIPTION OF THE PREFERRED EMBODIMENTS

Figure 1:
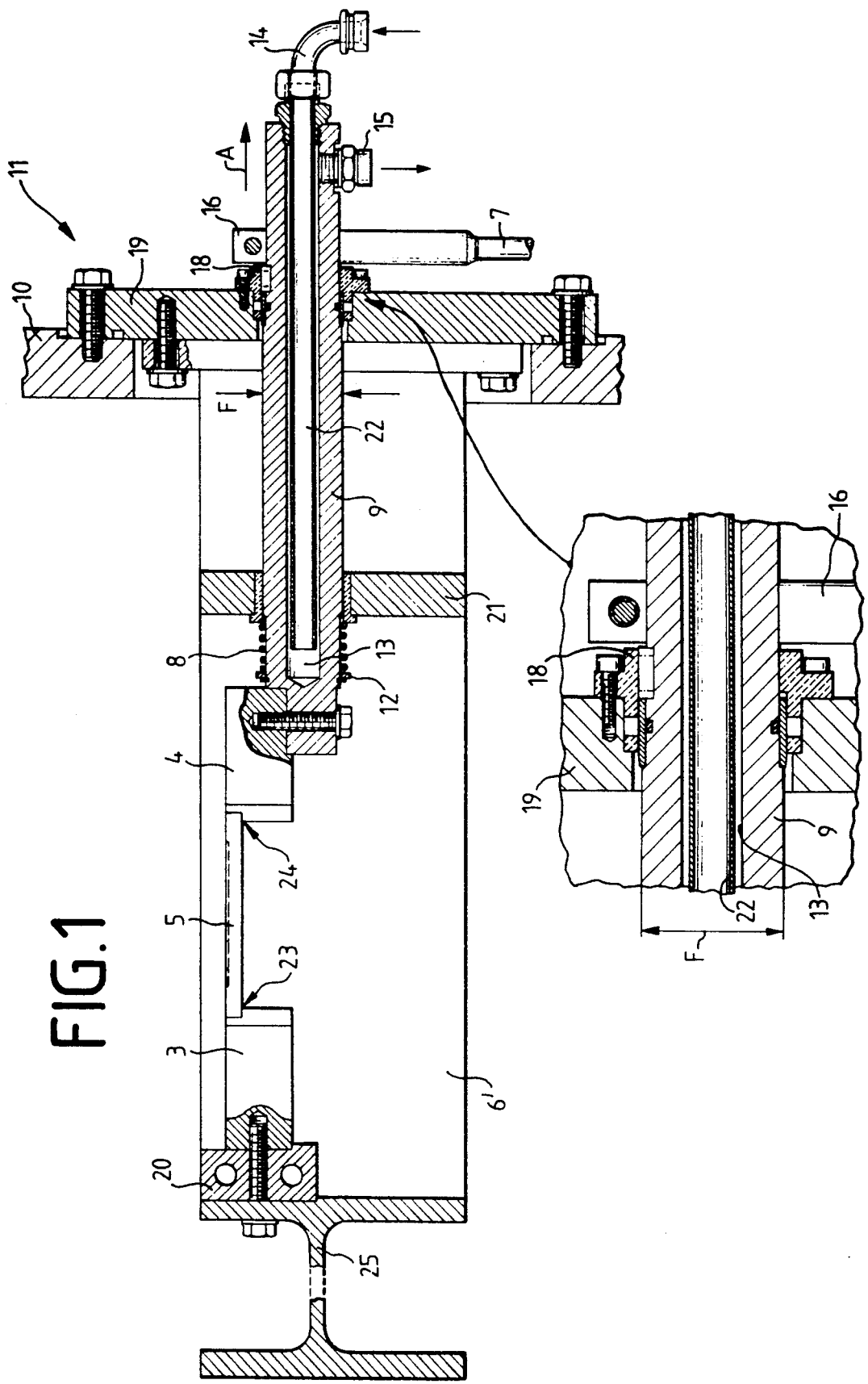
FIG. 1 represents a side view partially in section of a device for mounting an evaporator cell in a vacuum vapor depositing apparatus.

The row evaporator consists essentially of the supporting body 6 which is fixedly disposed on the inside of the wall 10 of the process chamber 11 on a flange 19, the grounded bus bar 20 fixedly bolted to the supporting body 25, the first clamp jaws 3, 3', . . . supported on the bus bar 20, the second clamp jaws 4, 4', . . . lying opposite these first clamp jaws and held each by a plunger 9, the evaporator cell 5, 5', . . . , held by both jaws 3, 4 and 3', 4' and . . . , the terminal 16, 16', . . . , enveloping each plunger 9, with the high-current feed line 7 fastened to it, the crossmember or supporting rib 21 made integral with the supporting body 6, the electrically insulating bushings 17, 17', . . . , surrounded in each case by the supporting rib 21, the sliding guide 18, 18', . . . inserted into an opening in the intermediate flange 19 for a rod-like plunger 9, 9', . . . , the blind bore 13 provided in each plunger 9 with an inserted coolant distributing tube 22, the connections 15, 15', . . . for the coolant water returns and the connections 14, 14', . . . for the cooling water feed lines.

To be able to insert the evaporator cell 5 into the apparatus, first the plunger 9 must be shifted to the right in the direction of arrow A against the force of spring 8, which is easily done since the plunger has essentially the configuration of a cylindrical bolt which has to be moved against only slight friction in the bushed bearing 17 and the vacuum—tight guide 18. The evaporator cell 5 can then be inserted into the two indentations 23 and 24 which are provided on the confronting ends of the jaws 3 and 4. If the plunger 9 is then released, the spring 8, which thrusts at one end against the front of the electrically insulating bushed bearing 17 in the cross member 21 and at the other end engages the collar 12 of the plunger 9, shifts the plunger 9 leftward against the direction of arrow A to such an extent that the evaporator cell 5 is held with sufficient force by the two jaws 3 and 4. Upon the evacuation of the process chamber 11, when a pressure difference establishes itself between the space on the left of the tank wall 10 and the atmosphere surrounding the apparatus, the differential pressure acts on the cross-sectional surface F of the plunger 9, so that the clamping force on the evaporator cell 5 increases considerably (e.g., by a factor of 10), and an absolutely secure electrical contact is provided between the jaws 3 and 4 on the one hand and the evaporator cell 5 on the other.

Of great importance to the safety of operation of the device described above is the arrangement of a cooling system in every single plunger 9. The coolant water flows through the feed line 14 and the distribution tube 22 into the blind bore 13 and from the latter out through the connection 15 into the coolant return. If during operation a leak should occur, it can occur only in the area of the two connections 14 and 15; this is of no importance to the safety of operation of the apparatus, since in no case can coolant enter the interior of the process chamber. The electrical feed line 7 is also so constructed that it is external, i.e., that the clamp 16 which is connected with the power cable 7 can be replaced at any time without requiring access to the interior of the process chamber.

I claim:

1. Row evaporator for vacuum vapor coating apparatus, especially for tape coating apparatus, comprising: a process chamber having a wall, a plurality of conductively heated evaporator cells disposed in the process chamber and in a plane and individually controllable in output, an electrically conductive support extending over an entire length of the row evaporator, jaw-like electrical contacts being connected to the plurality of evaporator cells and being held by the support and jaw-like contacts of one polarity being electrically connected to the support, while jaw-like contacts of another polarity are mounted in an insulated manner on the support, electrical feeders held in an insulated manner and connected with the jaw-like contacts of another polarity, a plunger affixed to each jaw-like contact of another polarity and extending in a plane parallel to the plane of the evaporator cells, an end of the plunger remote from the evaporator cell being brought sealingly and longitudinally displaceably through the wall of the process chamber and this end being exposed to the pressure of the ambient air.

2. Row evaporator according to claim 1, which includes a spring element thrusting at one end against one of the supporting body and the inside of the wall of the process chamber and at another end against the plunger for producing a bias force acting on the jaw-like contact with the plunger affixed thereto.

3. Row evaporator according to claim 1, which includes a blind bore, a cooling water feed line and a cooling water return which correspond with the blind bore, both the cooling water feed line and the cooling water return entering from the outside of the process chamber into the end, which is exposed to the ambient air, of the plunger.

4. Row evaporator according to claim 1, which includes a clamp connected to a power feed and in which the end of the plunger extending outwardly into the ambient air is grasped by the clamp.

5. Row evaporator according to claim 1 and in which the support includes a slide bushing and the plunger has sections of unvarying cross-sectional profile in an area where it passes through the wall of the process chamber and in an area of the slide bushing.

* * * * *